United States Patent [19]
Schulz et al.

[11] Patent Number: 6,126,740
[45] Date of Patent: *Oct. 3, 2000

[54] SOLUTION SYNTHESIS OF MIXED-METAL CHALCOGENIDE NANOPARTICLES AND SPRAY DEPOSITION OF PRECURSOR FILMS

[75] Inventors: Douglas L. Schulz, Denver; Calvin J. Curtis, Lakewood; David S. Ginley, Evergreen, all of Colo.

[73] Assignee: Midwest Research Institute, Kansas City, Mo.

[*] Notice: This patent is subject to a terminal disclaimer.

[21] Appl. No.: 09/014,326

[22] Filed: Jan. 27, 1998

Related U.S. Application Data

[63] Continuation-in-part of application No. 08/536,348, Sep. 29, 1995, Pat. No. 5,711,803.

[51] Int. Cl.$^7$ .................................................... C30B 1/02
[52] U.S. Cl. .................. 117/4; 117/7; 117/9; 117/956; 252/62.3 ZT; 252/62.3 GA
[58] Field of Search .............................. 117/4, 7, 9, 956; 252/62.3 ZT, 62.3 GA

[56] References Cited

U.S. PATENT DOCUMENTS

| | | |
|---|---|---|
| 4,225,408 | 9/1980 | Barlow et al. ...................... 204/181 N |
| 5,028,274 | 7/1991 | Basol et al. .............................. 136/264 |
| 5,215,631 | 6/1993 | Westfall ................................ 204/64 R |
| 5,262,357 | 11/1993 | Alivisatos et al. ...................... 437/233 |
| 5,356,839 | 10/1994 | Tuttle et al. ............................ 437/225 |
| 5,363,798 | 11/1994 | Yoder ........................................ 117/89 |
| 5,436,204 | 7/1995 | Albin et al. ............................. 437/225 |
| 5,441,897 | 8/1995 | Noufi et al. .................................. 437/5 |
| 5,470,910 | 11/1995 | Spanhel et al. ......................... 524/785 |
| 5,491,114 | 2/1996 | Goldstein ................................ 437/233 |
| 5,537,000 | 7/1996 | Alivisatos et al. ...................... 313/506 |
| 5,559,057 | 9/1996 | Goldstein ................................ 437/228 |
| 5,576,248 | 11/1996 | Goldstein ................................ 437/225 |
| 5,711,803 | 1/1998 | Pehnt et al. ................................. 117/4 |

OTHER PUBLICATIONS

"Preparation of Colloidal Semiconductor Solutions of $MoS_2$ and $WSe_2$ via Sonication," M. Gutierrez, et al., *Ultrasonics*, vol. 27, (1989), pp. 259–261.

"Characterization of Solution–Synthesized CdTe and HgTe," M. Mullenborn, et al., *Applied Physics A*, (1993), pp. 317–321.

"Quantum Size Effects in Zinc Oxide Nanoclusters Synthesized by Reactive Sublimation," Jackie Y. Ying, et al., *Materials Research Society Symposium Proceedings*, vol. 286, (1993), pp. 73–79.

"Nanoparticle Precursor Route to Low–Temperature Spray Deposition of CdTe Thin Fillms," Martin Pehnt, et al., *Applied Phys. Lett.*, vol. 76, (1995), pp. 2176–2178.

"Nanocrystalline Solutions of Precursor Solutions to the Spray Deposition of CdTe Thin Films," Martin Pehnt, et al., *Mater. Res. Soc.*, (1995), pp. 461–467.

"Solution Synthesis and Photoluminescence Studies of Small Crystallites of Cadmium Telluride," Robert F. Jarvis, Jr., et al., *Materials Research Society Symposium Proceedings*, vol. 272, (1992), pp. 229–234.

"Characterization of Solution–Synthesized CdTe and HgTe," M. Mullenborn, et al., *Applied Physics A*, (1993), pp. 317–321.

"Photoluminescence in Spray–Pyrolyzed CdTe," Bernard J. Feldman, *Applied Physics Letter*, vol. 9, (1981), pp. 703–705.

*Primary Examiner*—Robert Kunemund
*Attorney, Agent, or Firm*—Ken Richardson; Paul J. White

[57] ABSTRACT

A colloidal suspension comprising metal chalcogenide nanoparticles and a volatile capping agent. The colloidal suspension is made by reacting a metal salt with a chalcogenide salt in an organic solvent to precipitate a metal chalcogenide, recovering the metal chalcogenide, and admixing the metal chalcogenide with a volatile capping agent. The colloidal suspension is spray deposited onto a substrate to produce a semiconductor precursor film which is substantially free of impurities.

43 Claims, 2 Drawing Sheets

6,126,740

SOLUTION SYNTHESIS OF MIXED-METAL CHALCOGENIDE NANOPARTICLES AND SPRAY DEPOSITION OF PRECURSOR FILMS

CROSS-REFERENCE TO OTHER APPLICATIONS

This patent application is a continuation-in-part of U.S. patent application Ser. No. 08/536,348, filed Sep.29, 1995, and entitled "Preparation of a Semiconductor Thin Film," now U.S. Pat. No. 5,711,803. U.S. patent application Ser. No. 08/535,981, filed Sep. 29, 1995. and entitled "Semiconductor Nanoparticle Colloids" is a copending application.

CONTRACTUAL ORIGIN OF THE INVENTION

The United States Government has rights in this invention under Contract No. DE-AC36-83CH10093 between the U.S. Department of Energy and the National Renewable Energy Laboratory, a Division of Midwest Research Institute.

BACKGROUND OF THE INVENTION

1. . Field of the Invention

The present invention relates generally to preparation of colloidal suspensions of semiconductor nanoparticles and, more particularly, to preparing stable colloidal suspensions of mixed-metal chalcogenide nanoparticles and to the spray deposition of mixed-metal chalcogenide precursor films.

2. Description of the Prior Art

Photovoltaic devices, used extensively in a myriad of applications, have generated considerable academic and commercial interest in recent years. Photovoltaic devices (solar cells) utilize the specific electronic properties of semiconductors to convert the visible and near visible light energy of the sun into usable electrical energy. This conversion results from the absorption of radiant energy in the semiconductor materials which frees some valence electrons, thereby generating electron-hole pairs. The energy required to generate electron-hole pairs in a semiconductor material is referred to as the band gap energy, which in general is the minimum energy needed to excite an electron from the valence band to the conduction band.

Semiconductor materials comprised of metals and Group 16 elements (commonly referred to as chalcogens) are important candidate materials for photovoltaic applications, since many of these compounds (metal chalcogenides) have optical band gap values well within the terrestrial solar spectra. Mixed-metal chalcogenide semiconductors, such as copper-indium-diselenide ($CuInSe_2$). copper-gallium-diselenide ($CuGaSe_2$), and copper-indium-gallium-diselenide ($CuIn_{1-x}, Ga_xSe_2$), all of which are sometimes generically referred to as $Cu(In,Ga)Se_2$, are of particular interest for photovoltaic device applications because of their high solar energy to electrical energy conversion efficiencies. Sulphur (S) can also be, and sometimes is, substituted for selenium, so the compound is sometimes also referred to even more generically as $Cu(In,Ga)(Se,S)_2$ to comprise all of those possible combinations. The mixed-metal chalcogenides are typically coupled with a second semiconductor material of different conductivity type to produce a high efficiency heterojunction photovoltaic cell. The conversion efficiencies of mixed-metal chalcogenide semiconductor materials have been shown to exceed seventeen percent (17%) in active areas and to approach seventeen percent (17%) in total areas, which is quite high for current state-of-the-art solar cell technologies. See Tuttle, J. R., et al., Mat. Res. Soc. Symp. Proc. (1996) 426:143–151.

While the growth of single crystal $CuInSe_2$ has been studied, such as in U.S. Pat. No. 4,652,332, issued to T. Ciszek, the use of polycrystalline thin films is really more practical. Sputter depositing a ternary single phase $CuInSe_2$ layer, including the ability to determine the properties of the thin film, such as multilayer structures, by varying the sputter process parameters, is described in U.S. Pat. No. 4,818,357, issued to Case et al. However, the two fabrication methods of choice are: (1) Physical vapor deposition of the constituent elements, exemplified by the process disclosed in U.S. Pat. No. 5,141,564, issued to Chen et al., which is generally used as a research tool; and (2) The selenization of Cu/In metal precursors by either $H_2Se$ gas or Se vapor. The selenization technology generally exemplified by the processes described in U.S. Pat. No. 4,798,660, issued to Ermer et al., U.S. Pat. No. 4,915,745, issued to Pollack et al., and U.S. Pat. No. 5,045,409, issued to Eberspacher et al., is currently favored for manufacturing processes. However, thin films produced by the selenization processes usually suffer from macroscopic spatial nonuniformities that degrade performance and yield, and reproducible consistent quality from run to run is difficult to obtain and unpredictable. Therefore, working with $Cu(In,Ga)(Se,S)_2$ materials has still been difficult, particularly when scaling up.

U.S. Pat. No. 5,356,839, issued to Tuttle et al., U.S. Pat. No. 5,441,897, issued to Noufi et al., and U.S. Pat. No. 5,436,204, issued to Albin et al. describe methods for producing high quality $Cu(In,Ga)(Se,S)_2$ thin films using vapor-phase recrystallization techniques. The fabrication processes described in these patents, each of which is assigned to the assignee of the present application, provide improved performance and yield, and more reproducible consistent quality than prior methods. For example, U.S. Pat. No. 5,356,839 describes a process for fabricating $Cu_w(In,Ga_y)Se_z$ films by initially forming a Cu-rich, phase-separated compound mixture comprising $Cu(In,Ga):Cu_xSe$ on a substrate, then converting the excess $Cu_xSe$ to Cu(In, Ga)$Se_2$ by exposing it to an activity of In and/or Ga, either in vapor In and/or Ga form or in solid $(In,Ga_y)Se_z$. The characteristic of the resulting $Cu_w(In,Ga_y)Se_z$ can be controlled by the temperature. Higher temperatures, such as 500°–600° C., result in a nearly stoichiometric Cu(In,Ga) $Se_2$, whereas lower temperatures, such as 300°–400° C., result in a more Cu-poor compound, such as the $Cu_2(In,Ga)_4Se_7$ phase. U.S. Pat. Nos. 5,441,897 and 5,436,204 describe further modifications of the recrystallization process.

In addition to selenium and sulfur, another chalcogen, tellurium (Te), has also been used as a component in semiconductor materials for thin-film solar cells, usually in combination with Group 12 metals such as cadmium (Cd) and mercury (Hg). One common method for making CdTe thin films is a spray pyrolysis technique in which aqueous solutions of cadmium chloride and tellurium oxide are deposited on a substrate at deposition temperatures between about 425° C. and 500° C. Like the $Cu(In,Ga)(Se,S)_2$ compounds, Te-based materials are typically coupled with a second semiconductor material of different conductivity type, such as cadmium sulfide (CdS).

While the above-described metal chalcogenide semiconductor films provide relatively high conversion efficiencies, commercial use of these films is problematic for several reasons. As discussed above, films produced by selenization usually suffer from macroscopic spatial nonuniformities, which affects device performance. Moreover, chalcogenide-based semiconductor thin films generally require relatively elaborate and expensive synthesis routes, usually involving high vacuum, complex chemical reactions, multiple processing steps, and low product yields. To be commercially useful, metal chalcogenide films must be amenable to economical mass production techniques. It is generally accepted that large-scale terrestrial photovoltaic power generation using chalcogenide-based materials will only be economical when low-cost, high quality and highly efficient thin-film solar cells are developed. However, a major disadvantage of current chalcogenide-based films is the high vacuum and high processing temperature required during deposition of the precursor film. The high processing temperatures significantly increase the energy costs, and place stringent thermal requirements on the underlayers, substrates and other related structures, while high vacuum increases capital expenses.

One way to reduce the high deposition temperatures of semiconductor precursor films is to lower the melting point of the semiconductor material by decreasing the size of the molecular crystals. The reduction of the melting point in nanometer-sized metal and molecular clusters has been the focus of numerous investigations and simulations. (See, e.g., Ph. Buffat and J. -P. Borel, *Phys. Rev. A* (1976) 13:2287; M. Y. Hahn and R. L. Whetten, *Phys. Rev. Lett.* (1988) 61:1190: and R. S. Berry, et al., *Phys. Rev. A* (1984) 30:919.) The reduced melting temperature in Groups II-VI and III-V materials, such as CdS and GaAs, has been demonstrated. (A. N. Goldstein, C. M. Echer and A. P. Alivisatos, *Science* (1992) 256:1425.)

In addition to the melting point reduction, nanocrystalline semiconductors possess a number of unique physicochemical properties such as quantum size effects, size-dependent chemical reactivity, optical non-linearity, and efficient photoelectron emission. One particular application utilizing semiconductor nanoparticle precursors is described in co-pending and commonly assigned U.S. patent application Ser. No. 08/536,348, which is incorporated by reference in its entirety herein. As described therein, semiconductor nanoparticles such as cadmium telluride can be deposited onto a substrate whose surface temperature during nanoparticle deposition, although significantly lower than conventional deposition temperatures, is sufficient to cause simultaneous fusion of the nanoparticles, thereby effecting film growth. Beyond the inherent energy savings associated with a reduced thermal budget, the reduced deposition temperature allows the use of lower cost substrates such as soda-lime glass, while alleviating substrate out diffusion and relieving thermal stress. Moreover, in addition to providing a simple one-step, low-temperature deposition process, the method described in the referenced application also produces a relatively thick semiconductor film, as compared to the films produced by prior methods.

U.S. Pat. No. 5,262,357, issued to Alivisatos et al., describes a method for forming nanocrystals using a colloidal precipitation technique, specifically the "reverse micelle" process. The Alivisatos et al. process comprises reacting salts in the presence of an organic solvent, and then destabilizing the resultant suspension with a conventional capping agent, such as a thioacid. Unlike conventional semiconductor materials, semiconductor nanoparticles tend to interact and agglomerate in a colloidal suspension, and thus must be stabilized or "capped" to prevent decomposition of the colloidal suspension. Unfortunately, because conventional capping agents are non-volatile, they tend to decompose rather than volatilize, thereby introducing substantial impurities (e.g., carbon) into the film. Although such impurities are not necessarily fatal to film performance, they degrade the electronic properties of the semiconductor film.

The present inventors have discovered that the above-discussed impurity problem associated with nanoparticle presursors can be eliminated by using a volatile capping agent, which, instead of breaking down and introducing impurities into the film, volatilizes away during deposition. The use of volatile capping agents to produce a stable nanoparticle colloidal suspension is described in co-pending and commonly assigned U.S. patent application Ser. No. 08/535,981, which is incorporated by reference in its entirety herein. As described therein, a volatile capping agent, such as a volatile coordinating Lewis base, is added during and/or after synthesis of the nanoparticle precipitate. The resulting mixture is sonicated and centrifuged to produce a concentrated colloidal suspension, then diluted with additional volatile capping agent to produce a colloidal suspension. When deposited on a substrate, the colloidal suspension forms a substantially carbon-free precursor film.

In addition to the high energy costs associated with mixed-metal chalcogenides, as discussed above, a number of other practical and technical limitations have prevented scaling up to production. One complication preventing the mass production of chalcogenide-based films is the lack of predictability and consistency in the quality of the films. Although reproducible consistent quality is difficult to obtain with any semiconductor precursor material, the problem is exacerbated when using a multinary system such as mixed-metal chalcogenides. A high degree of both lateral and vertical control of composition is required during processing to produce device-quality semiconductor films. Unfortunately, because of the complexity of conventional synthesis routes. such control has not yet been achieved for these chalcogenide materials. Moreover, some of the key constituents in mixed-metal chalcogenide materials, such as indium and gallium in $Cu(In,Ga)(Se,S)_2$ compounds, are very expensive, and current processes are somewhat wasteful of these materials.

A need therefore exists for an improved, metal chalcogenide material which, when spray deposited on a substrate, forms a high-quality semiconductor precursor film. This improved chalcogenide-based material should feature a variety of desirable physicochemical properties, including a relatively low melting point, efficient photoelectron emission, and a volatile capping agent. The improved material should be in the form of a stable, nanoparticle colloidal suspension which is amenable to spray deposition under moderate thermal conditions. Following spray deposition, the metal chalcogenide should form a low cost, high quality, precursor semiconductor film. A need also exists for an improved method for preparing nanoparticle colloids using a volatile capping agent. Finally, a need exists for a fabrication process that produces a better quality, mixed-metal chalcogenide film more consistently and more predictably than previously known processes, and with more efficient and cost effective utilization of materials. The improved process should achieve a predetermined film composition, without the need for precise control of the ratio of metals during processing. Until this invention, no such compositions or methods existed.

SUMMARY OF THE INVENTION

Accordingly, it is a general object of this invention to provide a colloidal suspension comprising metal chalcogenide nanoparticles which, when spray deposited on a substrate, forms a low cost, high quality, semiconductor precursor film.

It is another object of this invention to provide a metal chalcogenide composition having improved physicochemical properties.

It is a more specific object of this invention to provide a metal chalcogenide composition having a relatively low melting point.

It is another specific object of this invention to provide a precursor material comprising semiconductor nanoparticles stabilized by a volatile capping agent.

It is a still further object of this invention to provide a metal chalcogenide composition which, when deposited on a substrate, forms a substantially impurity-free precursor film.

It is another general object of this invention to provide a metal chalcogenide composition having all of the above attributes.

It is yet another general object of this invention to provide a method for making a metal chalcogenide composition having all of the above attributes.

It is yet another object of this invention to provide a process for preparing a stable, nonaqueous nanoparticle colloidal suspension using a volatile capping agent.

It is a further object of this invention to provide a process that produces a better quality, mixed-metal chalcogenide film more consistently and more predictably than previously known processes.

It is also an object of this invention to provide a method of producing high-quality, mixed-metal chalcogenide films more consistently and with more efficient and cost effective utilization of materials. It is another object of this invention to provide a method of depositing mixed-metal chalcogenide precursor films having substantially the same stoichiometry as the precursor colloid.

Still another object of this invention is to provide a process for producing high quality, mixed-metal chalcogenide thin films that does not require precise control of the ratio of metals during processing, thus can be scaled up easily to production of large areas and to commercial quantities.

To achieve the foregoing and other objects and in accordance with the purposes of the present invention, as embodied and broadly described herein, the colloidal suspension of this invention comprises metal chalcogenide nanoparticles and a volatile capping agent. The metal chalcogenides may be, for example, $Cu(In_{1-x}Ga_x)Se_2$, CdS and CdTe. The metal is preferably a Group 11, Group 12, or Group 13 metal, such as copper, indium, gallium or cadmium. The chalcogen may be selenium, sulfur or tellurium. The volatile capping agent may be ammonia, methyl amine, ethyl amine, actonitrile, ethyl acetate, methanol, ethanol, propanol, butanol, pyridine, ethane thiol, tetrahydrofuran, and diethyl ether. Preferably, the volatile capping agent is methanol, acetonitrile, or pyridine. The nanoparticles preferably have an average particle size of from about 1 to about 50 nm, and more preferably from about 10 to about 30 nm.

To further achieve the foregoing and other objects and in accordance with the purposes of the present invention, as embodied and broadly described herein, one embodiment of this invention comprises a process for preparing a nonaqueous colloidal suspension of metal chalcogenide nanoparticles which, when deposited onto a substrate, provide a high-quality, low-cost precursor film. The method of this invention includes the steps of reacting a metal salt with a chalcogenide salt to form metal chalcogenide nanoparticles, and mixing the metal chalcogenide nanoparticles with a volatile capping agent to form a nonaqueous colloidal suspension. The metal salt may be a metal halogenide, metal sulfate, metal nitrate, metal phosphate, complex metal salt, metal alcoholate, metal phenolate, metal carbonate, metal carboxylate, metal hydride, or a metallo-organic compound. Preferably, the metal salt is metal iodide. The chalcogenide salt may contain an alkali metal or an alkaline-earth metal, such as sodium. The volatile capping agent may be ammonia, methyl amine, ethyl amine, actonitrile, ethyl acetate, methanol, ethanol, propanol, butanol, pyridine, ethane thiol, tetrahydrofuran, and diethyl ether. Preferably, the volatile capping agent is methanol, acetonitrile, or pyridine. The process may include the step of reacting a metal salt with a chalcogenide salt in an organic solvent to form the metal chalcogenide nanoparticles and a soluble byproduct. The organic solvent may be methanol, ethanol, propanol, butanol, diethyl ether, dibutyl ether, tetrahydrofuran, butoxyethanol, ethyl acetate, pentane, hexane, cyclohexane, or toluene. Preferably, the organic solvent is methanol. The process may also include the step of separating the metal chalcogenide nanoparticles from the soluble byproduct prior to mixing the metal chalcogenide particles with the volatile capping agent. This step may further include the steps of sonicating a mixture of the metal chalcogenide nanoparticles and the soluble byproduct, and centrifuging the mixture to form a slurry of metal chalcogenide nanoparticles and a supernatant comprising the soluble byproduct. The supernatant may be decanted from the slurry of metal chalcogenide nanoparticles. The step of mixing the metal chalcogenide nanoparticles with a volatile capping agent may further include the step of sonicating the mixture of the metal chalcogenide nanoparticles and the volatile capping agent.

In an alternate embodiment, the method for making a nonaqueous colloidal suspension of metal chalcogenide nanoparticles comprises the steps of reacting a metal salt with a chalcogenide salt in a nonaqueous medium comprising a volatile capping agent to form the metal chalcogenide nanoparticles and a soluble byproduct, separating the metal chalcogenide nanoparticles from the soluble byproduct, and mixing the metal chalcogenide nanoparticles with the volatile capping agent to form the nonaqueous colloidal suspension. The step of separating the metal chalcogenide nanoparticles may include the steps of sonicating a mixture of the metal chalcogenide nanoparticles and the soluble byproduct, and centrifuging the mixture to form a slurry of metal chalcogenide nanoparticles and a supernatant comprising the soluble byproduct. The supernatant may be decanted from the slurry of metal chalcogenide nanoparticles. The nonaqueous medium may include an organic solvent, such as methanol, ethanol, propanol, butanol, diethyl ether, dibutyl ether, tetrahydrofuran, butoxyethanol, ethyl acetate, pentane, hexane, cyclohexane, or toluene. The step of mixing the metal chalcogenide nanoparticles with the volatile capping agent may include the step of sonicating the mixture of the metal chalcogenide nanoparticles and the volatile capping agent.

To further achieve the foregoing and other objects and in accordance with the purposes of the present invention, another embodiment of this invention comprises a process for forming a film of metal chalcogenide material on a surface of a substrate. The process comprises the steps of preparing a colloidal suspension comprising metal chalcogenide nanoparticles and a volatile capping agent, and depositing the colloidal suspension onto the surface of the substrate. The step of depositing the colloidal suspension may include the step of heating the substrate to a temperature sufficient to cause fusion of the metal chalcogenide nanoparticles to produce a continuous metal chalcogenide film. The colloidal suspension may be spray deposited onto the surface of the substrate. The temperature of the substrate is preferably less than about 300° C. more preferably less than about 270° C., and most preferably less than about 240° C. The substrate may be soda-lime glass. The surface may include a smooth metallic layer, such as a layer of molybdenum, or a transparent conductive oxide.

BRIEF DESCRIPTION OF THE DRAWINGS

The accompanying drawings, which are incorporated in and form a part of the specifications, illustrate the preferred embodiments of the present invention, and together with the descriptions serve to explain the principles of the invention. In the Drawings.

DETAILED DESCRIPTION OF THE PREFERRED EMBODIMENTS

Figure 1:
FIG. 1 is a transmission electron micrograph of an agglomerate of Cu—In—Ga—Se nanoparticles, produced in accordance with the present invention.

This invention provides a nonaqueous colloidal suspension of metal chalcogenide nanoparticles for use in the spray deposition of a precursor film for a photovoltaic device. The nonaqueous colloidal suspension comprises a metal chalcogenide material and a volatile capping agent. The present invention also provides a method of making a nonaqueous colloidal suspension of metal chalcogenide nanoparticles, which method includes reacting a metal salt with a chalcogenide salt in an organic solvent to precipitate a metal chalcogenide, recovering the metal chalcogenide, and admixing the metal chalcogenide with a volatile capping agent to produce a colloidal suspension of metal chalcogenide nanoparticles. The resulting colloidal suspension is spray deposited onto a suitable substrate to produce a semiconductor precursor film which is substantially free of impurities. The method for depositing a colloidal suspension of semiconductor nanoparticles onto a substrate is described in a related copending U.S. patent application Ser. No. 08/536,348, entitled "Preparation of a SemiconductorThin Film," now U.S. Pat. No. 5,711,803 which is incorporated by reference herein.

As used herein, the term "metal" refers to an element of Groups 3 through 13, inclusive, of the periodic table. Thus, the term "metal" broadly refers to the transition metal elements. Group 13 elements, and the lanthanide elements. Specific metals suitable for use in the present invention include scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os). cobalt (Co), rhodium (Rh), iridium (Ir), nickel (Ni), palladium (Pd), platinum (Pt), copper (Cu), silver (Ag), gold (Au), zinc (Zn), cadmium (Cd), and mercury (Hg) [transition metal elements]; boron (B). aluminum (Al), gallium (Ga), indium (In), and thallium (Tl) [Group 13 elements]; and lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu) [lanthanides]. In a preferred embodiment, the metal is an element of Groups 11 through 13, inclusive. In a particularly preferred embodiment, the metal is copper, indium, gallium, or cadmium.

The "metal salt" used in the methods of the present invention may be any compound which contains a metal, and whose sodium salt (e.g., NaX) is soluble in the organic solvent used to precipitate the metal chalcogenide. When used in the context of a metal salt, the term "salt" refers to halogenides, sulfates, nitrates, phosphates, complex salts, alcoholates, phenolates, carbonates, carboxylates, metalloorganic compounds, and the like. Preferably, the salt is a halogenide. In a particularly preferred embodiment, the salt is iodide and the sodium salt is NaI.

As used herein, the term "chalcogen" refers to an element of Group 16 of the periodic table. The term "chalcogenide" refers to a binary or multinary compound containing at least one chalcogen and at least one more electropositive element or radical. Preferably, the chalcogen is sulfur, selenium, or tellurium, and the "metal chalcogenide" is a metal sulfide, a metal selenid, or some mixture thereof For the purpose of providing a detailed description and an enabling embodiment, but not for the purpose of limitation, this description refers to "metal chalcogenides" and "mixed-metal chalcogenides." Unless the text indicates otherwise, the terms are used interchangeably. However, the present invention can be practiced using any suitable combination of metals and chalcogens, including both binary and multinary systems, and including single- or mixed-metals and/or single- or mixed-chalcogens. As will be understood by those of skill in the art, a "single-metal" compound means a compound containing only one type of metal; a "mixed-metal" compound means a compound containing more than one type of metal. Similarly, a "single-chalcogenide" means a compound containing only one type of chalcogen; a "mixed-chalcogenide" means a compound containing more than one type of chalcogen. Thus, for example, the metal chalcogenide compounds of the present invention may be expressed according to the following general formula:

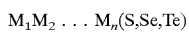

$$M_1 M_2 \ldots M_n(S, Se, Te)$$

where $M_1 M_2 \ldots M$, is any combination of metals, and (S,Se,Te) is any combination of S and/or Se and/or Te.

The "chalcogenide salt" used in the methods of the present invention may be any compound which contains a chalcogen, and which reacts with a metal salt to form a metal chalcogenide. As used herein, "chalcogenide salt" refers to a salt of the chalcogenide anion which is partially soluble in the reaction medium, including, without limitation, alkali or alkaline-earth metal salts of the corresponding anion. Preferably, the salt contains a metallic element of Group 1. In a particularly preferred embodiment, the salt contains sodium.

The metal salt and the chalcogenide salt are selected in such a manner that the resulting metal chalcogenide is insoluble or slightly soluble in the reaction medium. Thus, any metal salt and any chalcogenide salt which react to produce an insoluble or slightly soluble chalcogenide product are useful reagents in accordance with the methods of the present invention. Moreover, it should be understood that the metal salt(s) and the chalcogenide salt(s) used in the methods of this invention may be applied as individual compounds and/or as mixtures comprising two or more compounds.

For the purposes of simplicity, the description of the methods and compositions of this invention will focus primarily on $Cu(In_{1-x}Ga_x)Se_2$-, CdTe- and CdS-based structures. However, it should be understood that any metal or various combinations of metals including any ratio thereof, may be substituted for the Cu, In, Ga and Cd components and that S, Te, and Se or various combinations of S, Te, and Se may be substituted for the Se, Te and S components described in these methods and compositions, and that such substitutions are considered to be equivalents for purposes of this invention. Also, where several elements can be combined with or substituted for each other, such as In and Ga, or Se, Te and S, in the component to which this invention is related, it is not uncommon in this art to include in a set of parentheses those elements that can be combined or interchanged, such as (In,Ga) or (Se,Te,S). The descriptions in this specification sometimes use this convenience. Finally, also for convenience, the elements are discussed with their commonly accepted chemical symbols, including copper (Cu), indium (In), gallium (Ga), cadmium (Cd), selenium (Se), sulfur (S), and the like.

The "volatile capping agent" used in the present invention may be any capping agent (also sometimes referred to as stabilizing agent) known in the art which is sufficiently volatile such that, instead of decomposing and introducing impurities into the film, it evolves during film deposition. As used herein, the term "volatile" is defined as having a boiling point less than about 200° C. at ambient pressure. The purpose of the capping agent is to prevent interaction and agglomeration of the nanoparticles, thereby maintaining a uniform distribution of the colloidal substance (metal chalcogenide nanoparticles), the disperse phase, throughout the dispersion medium. Volatile capping agents suitable for use in the present invention are volatile compounds which contain at least one electron pair-donor group or a group which can be converted into such an electron pair-donor group. The electron pair-donor group can be electrically neutral or negative, and usually contains atoms such and O, N or S. Electron pair-donor groups include, without limitation, primary, secondary or tertiary amine groups or amide groups, nitrile groups, isonitrile groups, cyanate groups, isocyanate groups, thiocyanate groups, isothiocyanate groups, azide groups, thiogroups, thiolate groups, sulfide groups, sulfinate groups, sulfonate groups, phosphate groups, hydroxyl groups, alcoholate groups, phenolate groups, carbonyl groups and carboxylate groups. Groups that can be converted into an electron pair-donor group include, for example, carboxylic acid, carboxylic acid anhydride, and glycidyl groups. Specific examples of suitable volatile capping agents include, without limitation, ammonia, methyl amine, ethyl amine, actonitrile, ethyl acetate, methanol, ethanol, propanol, butanol, pyridine, ethane thiol, tetrahydrofuran, and diethyl ether. Preferably, the volatile capping agent is methanol, acetonitrile, or pyridine.

The organic solvent (also referred to herein as dispersion medium or dispersing medium) used in the present invention is not critical to the invention (less partial solubility of the metal salt), and may be any organic solvent known in the art, including, for example, alcohols, ethers, ether alcohols, esters, aliphatic and cycloaliphatic hydrocarbons, and aromatic hydrocarbons. Specific examples of suitable organic solvents include, without limitation, methanol, ethanol, propanol, butanol, diethyl ether, dibutyl ether, tetrahydrofuran, butoxyethanol, ethyl acetate, pentane, hexane, cyclohexane, and toluene. In a particularly preferred embodiment, the organic solvent is methanol.

It is important to note that the presence of water in the colloidal suspension causes destabilization, agglomeration, and colloid decomposition. Consequently, every effort should be made to avoid introducing even incidental amounts of water into the colloidal system. Although the mechanism of destabilization and agglomeration is not fully understood, and not wishing to be bound to any particular theory, it is believed that water causes colloidal decomposition through ligand exchange. Specifically, water molecules, because of their very strong binding ability, replace capping agents such as acetonitrile and methanol on the surface of the colloids. The resulting colloids, commonly referred to as "water-capped," are not suitable for the purposes of the present invention. Because of the relative strength of the water-particle dative bond, "water-capped" colloids would introduce oxygen impurities into the precursor film during deposition, thereby degrading the electronic properties of the semiconductor film. Also, "water-capped" nanoparticles precipitate out of the colloid as a consequence of the hydrophilic nature of the water cap and the hydrophobic nature of the organic solvent.

As will be appreciated by those of skill in the art, special techniques and equipment are available to effect a water-free or nonaqueous colloidal system. For example, standard solvent distillation can be used to "dry" the organic solvent by removing water and other impurities present in the organic phase. Solvent distillation is a standard and well-known technique. See. e.g., Gordon, A. J. and R. A. Ford, *The Chemist's Companion* (John Wiley & Sons, NY, 1972), p. 434. In addition, so-called "Schlenk" techniques and equipment, such as a Schlenk vacuum line and side-arm round bottomed flasks, are routinely employed in organometallic synthesis reactions to provide inert atmosphere working conditions for manipulating air sensitive and water-sensitive materials. See, e.g., McNally, J. P., et al.. "Cannula Techniques for the Manipulation of Air-Sensitive Materials," In: *Experimental Organometallic Chemistry: A Practicum in Synthesis and Characterization, Wayda, A. L. and M. Y. Darensbourg, eds., ACS Symposium Series* 357 (American Chemical Society, Washington, D.C., 1987), pp. 6–23. Again, such techniques are well known and within the skill of the ordinary artisan.

The method of making a nonaqueous colloidal suspension according to the present invention begins by reacting stoichiometric amounts of a metal salt with a chalcogenide salt in an organic solvent at reduced temperature to precipitate a metal chalcogenide. Because of the large differences in solubility between the resulting metal chalcogenide and the byproduct of the metathesis reaction, the two end products of this reaction can be readily separated from one another using standard separation techniques. Such separation techniques include, for example, sonication of the mixture, followed by centrifugation. The soluble byproduct is then removed, for example, by decanting using a cannula, leaving an isolated slurry of the metal chalcogenide. Volatile capping agent is then added to the isolated metal chalcogenide to produce a nonaqueous mixture. Finally, the mixture is sonicated for a period of time sufficient to facilitate "capping" of the nanoparticles by the capping agent, thereby forming a stable, nonaqueous colloidal suspension of metal chalcogenide nanoparticles.

The reaction conditions for the above-discussed metathesis reaction are not critical to the invention. Thus, the reaction between the metal salt and the chalcogenide salt can be conducted under moderate conditions, preferably below room temperature and at atmospheric pressure. The reaction is typically complete within a few seconds to several minutes.

In one embodiment of the present invention, volatile capping agent is included in the reaction mixture during nanoparticle synthesis. In this embodiment, stoichiometric amounts of the metal and chalcogenide salts are reacted in the presence of the volatile capping agent at a temperature and for a period of time sufficient to produce a nanoparticle precipitate. The precipitate is separated from the soluble byproduct of the metathesis reaction, then mixed with additional volatile capping agent to produce a nonaqueous mixture. This mixture is then sonicated and centrifuged to produce a concentrated colloidal suspension. The concentrated suspension is then diluted with additional volatile capping agent in an amount sufficient to produce a colloidal suspension suitable for deposition of a semiconductor precursor film.

In a second embodiment of the present invention, the volatile capping agent is added to the metal chalcogenide nanoparticles following completion of the metathesis reaction. In this embodiment, stoichiometric amounts of the metal and chalcogenide salts are reacted in a nonaqueous organic solvent at a temperature and for a period of time sufficient to produce a nanoparticle precipitate. The precipitate is separated from the soluble byproduct of the metathesis reaction, then mixed with volatile capping agent to produce a nonaqueous mixture. The mixture is then sonicated and centrifuged to produce a concentrated colloidal suspension. This concentrated suspension is diluted with additional volatile capping agent in an amount sufficient to produce a colloidal suspension suitable for deposition of a semiconductor precursor film.

The stability of the metal chalcogenide colloid produced by the method of the invention is evidenced by the colored nature of the supernatant following sonication and centrifugation, which is indicative of a stable colloid. It is well known that nanoparticle colloids are inherently unstable; nanoparticles in liquid media tend to agglomerate, rendering the colloid unstable.

Following the solution synthesis of the metal chalcogenite nanoparticles, the stable colloidal suspension is spray deposited onto a suitable substrate to form a precursor film. The substrate may be, for example, soda-lime silica glass or amorphous 7059 glass. The deposition can be on the bare glass substrate, but it may be preferable to include a smooth metallic surface, such as a one micrometer (1 $\mu$m) layer of molybdenum (Mo). The method for depositing a colloidal suspension of semiconductor nanoparticles onto a substrate is described in a related copending U.S. patent application Ser. No. 08/536,348. entitled "Preparation of a Semiconductor Thin Film," now U.S. Pat. No. 5,711,803 which is incorporated by reference herein. Briefly, the method comprises spray depositing the colloidal suspension onto a substrate whose surface temperature during deposition ($\geq 30°$ C.) is sufficient to cause substantially simultaneous fusion (coalescing) of the nanoparticles into a continuous thin film, and to effectuate film growth. Spray deposition of the colloidal suspensions is performed in a controlled atmosphere spraying box using a carrier gas such as helium. The temperature of the susceptor is high enough during deposition that, even after any cooling effect caused by the spray, the temperature of the nanoparticles is sufficient to facilitate fusion. Deposition of nanoparticles according to the invention results in the growth of contiguous, impurity free, phase-pure films. Such deposition can continue to thereby form films of multi-particle depth, as required for any particular application.

Following thermal processing of the precursor film, the metal chalcogenide semiconductor film may be incorporated into a photovoltaic device (solar cell). The typical solar cell includes a transparent substrate (such as soda-lime glass, as discussed above), a back contact layer (e.g., molybdenum), an absorber layer (also referred to as the first semiconductor layer), a buffer layer (e.g., CdS; also referred to as the second semiconductor layer), and a top electrical contact. The solar cell may also include an electrical contact or electrode pad on the top contact layer, and an anti-reflective (AR) coating on the front surface of the substrate to enhance the initial transmission of light into the semiconductor material. With the exception of the semiconductor materials of the present invention, the component structures of the solar cell are known in the art and not a part of this invention.

As discussed above, the amounts of metal salt and chalcogenide salt used to produce the colloidal suspension may vary widely depending on the particular application. In general, the amounts of these reagents will depend upon the desired composition of the semiconductor thin film. For example, it is generally believed by persons skilled in this art that the best electronic device properties, thus the best conversion efficiencies, are obtained when the mole percent of copper is about equal to the mole percent of the indium, the gallium, or the combination of the indium and gallium in the $Cu(In,Ga)Se_2$ compound or alloy. The selenium content will not generally be important to the electronic properties of the semiconductor if the growth conditions supply sufficient selenium so that it comprises about fifty atomic percent (50 at. %) of the $Cu(In,Ga)Se_2$ compound to form the desired anion crystal lattice structures.

A significant advantage associated with the method of the present invention is the improved predictability and reproducibility of the fabrication process, and the significant increase in control over the final composition of the semiconductor film. As discussed above, conventional processes require precise monitoring and manipulation of the ratio of metals during the deposition process, a problem which has thus far prevented mass production of mixed-metal chalcogenide semiconductor films. Surprisingly, however, the metal stoichiometry of the mixed-metal chalcogenide films produced by the present invention is nearly identical to the stoichiometry of the starting materials.

As shown in Example I, a Cu—In—Ga—Se colloid with a metal stoichiometry of $Cu_{1.10}In_{0.68}GA_{0.23}$ produced a Cu—In—Ga—Se precursor film with a metal stoichiometry of $Cu_{1.13}In_{0.64}Ga_{0.23}$, a difference which is approximately equal to the error associated with the inductively coupled plasma atomic emission spectroscopy (ICPAES) measurement itself. Thus, when a particular metal ratio is desired in the precursor film (e.g., $Cu_xIn_yGa_z$), the ratio is achieved simply by dissolving the corresponding molar ratio of metal salts (e.g., x CuI+y $InI_3$+z $GaI_3$) in the volatile capping agent, reacting this solution with a solution of chalcogenide salt (e.g., a methanolic NaSe solution), then spraying the Cu-In-Ga-Se colloidal suspension onto a heated substrate. Surprisingly, there is no detectable difference between the metal salt stoichiometry in the reaction flask and the metal chalcogenide stoichiometry in the precursor film. Because the chemical composition of the precursor film parallels that of the colloidal suspension, the stoichiometries of subsequently deposited films can be conveniently controlled via initial solution synthesis. Although this aspect of the invention is exemplified using a $Cu(In_{1-x}Ga_x)Se_2$ compound, the method is applicable to any metal or combination of metals, any chalcogen or combination of chalcogens, and any combination of metals and chalcogens. Thus, the method of the present invention offers improved lateral control over film composition, and hence improved reproducibility and product yield, over prior art processes. Moreover, because the stoichiometries of precursor films is predetermined during initial solution synthesis, the invention also offers improved vertical control. In other words, by modifying the composition of the colloid during spray deposition, such as by alternating material reservoirs. vertical film composition can be controlled in a layer-by-layer fashion. Finally as a further consequence of the improved control and predictability, the present invention offers the additional benefit of more efficient and cost effective utilization of materials, by eliminating the waste commonly associated with conventional fabrication processes.

Another significant advantage associated with the methods of the present invention is the improved quality of the semiconductor precursor films, as compared to films produced by current methods. As previously discussed, semiconductor nanoparticles tend to interact and agglomerate in liquid media, and thus require the use of capping agents to maintain the colloidal system. Unfortunately, conventional capping agents are nonvolatile, and thus tend to decompose during deposition, leaving impurities in the film. Because the capping agents used in the present invention are volatile, they evolve rather than decompose, thereby affording a substantially carbon-free film with improved electronic properties.

A yet further significant advantage of the methods of the present invention is the reduced melting point of the semiconductor materials, which allows film deposition at lower temperatures than conventional processes. Beyond the inherent energy savings associated with a reduced thermal budget, the reduced deposition temperature allows the use of lower cost substrates, such as soda-lime glass, while alleviating substrate out diffusion and relieving thermal stress.

The following examples demonstrate the practice and utility of the present invention but are not to be construed as limiting the scope thereof. Any suitable laboratory equipment known to those skilled in the art can be utilized to synthesize colloidal suspensions and fabricate precursor films, and analyze properties thereof. In the examples, inductively coupled plasma atomic emission spectroscopy (ICPAES) was performed using a Varian Liberty 150, manufactured by Varian Company; thermogravimetric analysis (TGA) was performed using a TGA 51 thermogravimetric analyzer, manufactured by TA Instruments; transmission electron microscopy (TEM) was performed using a Philips CM30, manufactured by Philips Company: X-ray diffraction (XRD) was performed using a Scintag X1 Diffraction System, manufactured by Scintag Company; and scanning electron microscopy (SEM) was performed using a JEOL JSM 840, manufactured by JEOL Company.

EXAMPLE 1

Cu-In-Ga-Se nanoparticle colloids were prepared by reacting a mixture of CuI, InI$_3$, and GaI$_3$ in pyridine with Na$_2$Se in methanol at reduced temperature under inert atmosphere as follows:

(1)

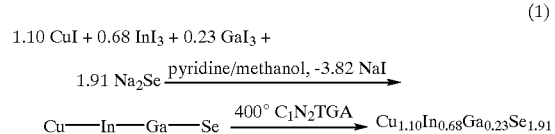

This reaction system is convenient in that the byproduct of the reaction (i.e.. NaI) is soluble in the methanol solvent while the product nanoparticles are insoluble. During the chemical workup, NaI salt is removed from the product mixture with the remaining Cu—In—Ga—Se nanoparticles forming a stable, methanol/pyridine colloid. Yields for this reaction typically exceed 90% as determined in sacrificial samples via solvent evaporation.

The Cu—In—Ga—Se nanoparticles were characterized using a number of techniques. ICPAES analysis was performed using a Varian Liberty 150 to determine the chemical composition of the solid constituent of the Cu—In—Ga—Se colloid, acquired by evaporating the methanol/pyridine solvent with a stream of nitrogen gas. As this analysis is complicated by evolution of H$_2$Se gas during dissolution of the solid with strong acid, only metal stoichiometries were assayed, ICPAES showed the metal stoichiometry of the product colloid matched the stoichiometric ratio of each of the starting metal iodides. TGA of the nanoparticles was carried out using a TA Instruments TGA 51 thermogravimetric analyzer with a Pt sample pan, a heating rate of 10° C./min and a N$_2$ purge rate of 90 mL/min. TGA performed on a sample of the solid constituent showed two distinct regions; a mass loss of 20 wt % from 50 to 250° C. (rate~0.10 wt %/° C.) and a mass loss of 1.3 wt % from 250 to 400° C. (rate 0.01 wt %/° C.).

TEM was performed on the Cu—In—Ga—Se nanoparticles using a Phillips CM30 operating at 300 kV with the samples being prepared by spraying diluted Cu—In—Ga—Se colloid onto 100 Å amorphous carbon coated 200 mesh Mo grids in a fume hood. FIG. 1 shows a TEM micrograph of a large agglomerate of nanoparticles. Apparent in the image are distinct dark particles surrounded by non-dense amorphous material. These particles were determined to be amorphous with no lattice fringes apparent at 300 kX magnification and only diffuse broad rings observed in the TEM electron diffraction pattern. The overall size distribution for the dark particles was estimated to be 10–30 nm. XRD data were collected using a Scintag X1 Diffraction System. XRD of the residual solid obtained after removing methanol/pyridine solvent from the colloid using a nitrogen gas stream showed broad maxima; also indicative of an amorphous phase. XRD of the TGA residue heated to 400° C. (see above) showed pure CIGS phase formation. Joint Commitee for Powder Diffraction Standards, International Center for Diffraction Data, 12 Campus Blvd., Newtown Square, Pa. 19073. No. 35-1102 (CuIn$_{0.7}$Ga$_{0.3}$Se$_3$), No. 29-575 (Cu$_2$Se), No. 6-680 (Cu$_{2-x}$Se), No. 20-494 (β-In$_2$Se$_3$), No. 5-724 (α-Ga$_2$Se$_3$).

The constituent metal selenide binaries, that is, Cu$_2$Se, In$_2$Se$_3$, and Ga$_2$Se$_3$, were prepared via a similar low temperature metathesis as follows:

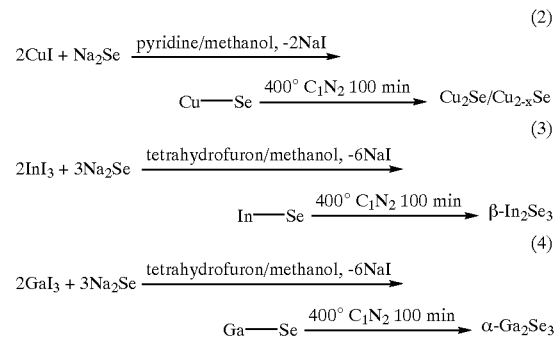

All metal selenide products from these reactions were amorphous by XRD and TEM. Upon heating at 400° C. for 100 min in flowing Ar, these Cu—Se, In—Se, and Ga—Se products exhibited XRD patterns indicative of mixed phase Cu$_2$Se/Cu$_{2-x}$Se, single-phase β-In$_2$Se$_3$, and single phase α-Ga$_2$Se$_3$, respectively. See Joint Commitee, supra. It may be inferred from this XRD data that these Cu—Se, In—Se, and Ga—Se colloids were amorphous Cu$_2$Se, In$_2$Se$_3$, and Ga$_2$Se$_3$ as-synthesized.

Cu—In—Ga—Se precursor films were prepared by spraying purified Cu—In—Ga—Se nanoparticle colloids onto heated molybdenum-coated sodalime glass substrates. Spray deposition of the colloids to form precursor Cu—In—Ga—Se films was performed in a nitrogen-purged Plas-Lab 818-GB glove box fitted with an evacuable antechamber. The precursor Cu—In—Ga—Se films were deposited onto molybdenum-coated sodalime glass substrates (2.5 cm×5.1 cm) heated to 144° C. using a modified hot plate with a thermocouple feedback loop. A precursor film thickness of 2.7±0.2 $\mu$m was attained by spraying~40 g of $1.25 \times 10^{-2}$M colloid over an area of 75 cm$^2$. A computer-controlled Velmex XY stepper motor system was used to raster a Vega 2000 aspiration-feed sprayer. Good film growth was observed at a sprayer-to-substrate distance of 13 cm using a nitrogen carrier gas flow rate~6 L/min at 20 p.s.i.

Figure 2:
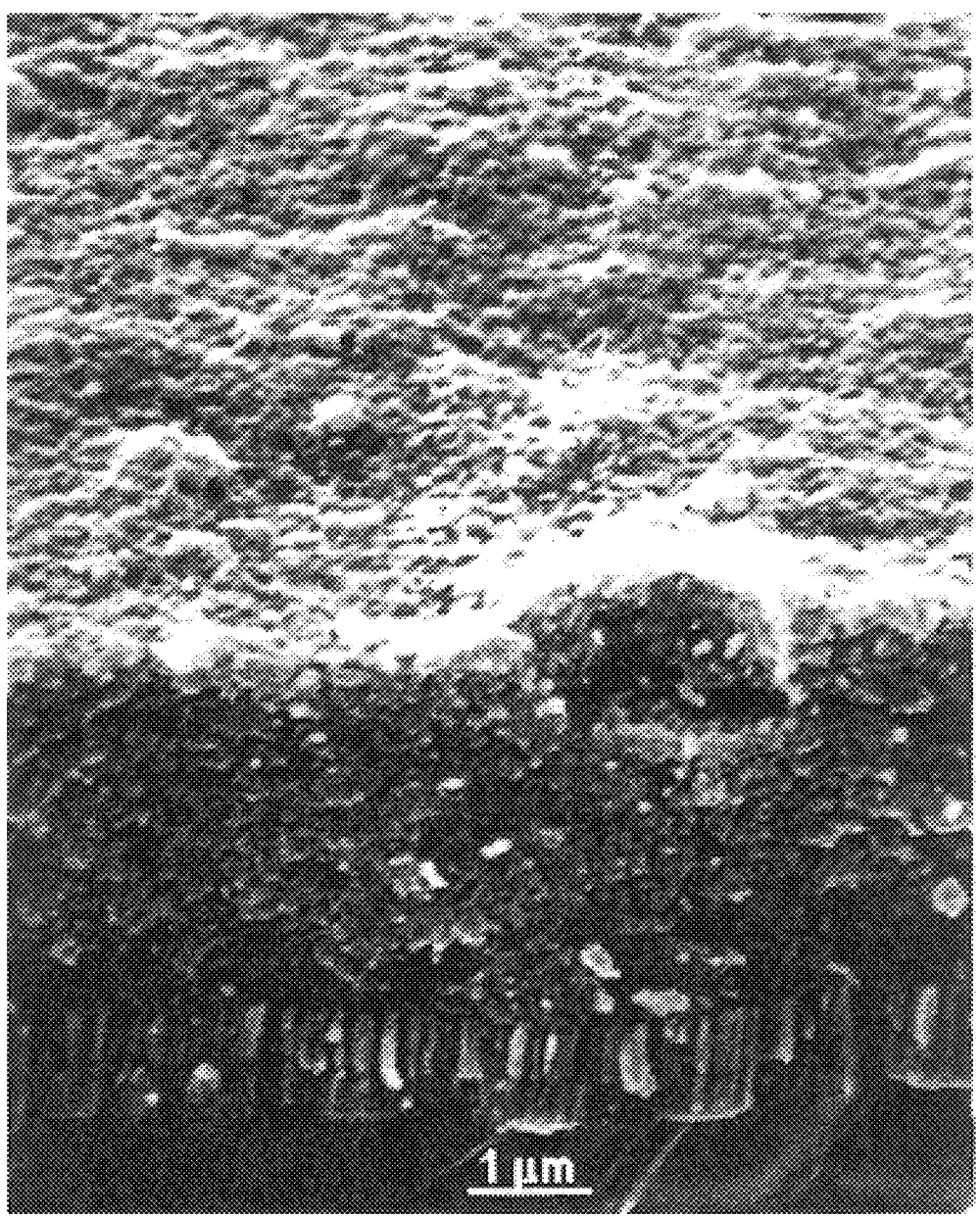
FIG. 2 is a scanning electron micrograph showing the morphology of a Cu—In—Ga—Se precursor film, produced in accordance with the present invention.

Morphologies of the Cu—In—Ga—Se precursor films were determined by SEM using a JEOL JSM 840. FIG. 2 is a cross-section SEM micrograph of a Cu—In—Ga—Se precursor film that was sprayed at 144° C. Apparent in the image are the glass substrate, a columnar layer of molybdenum and the Cu—In—Ga—Se precursor layer. It can be seen that the precursor film is composed of closely packed particles interspersed with voids. The porous nature of nanoparticle-derived films has been previously observed, Kamat, P. V., *Materials Technology* (1994) 9:147–149.

Chemical composition of the Cu—In—Ga—Se precursor films was probed by ICPAES. It was determined that the stoichiometry of the films was nearly identical to that of the precursor colloid. For example, a Cu—In—Ga—Se colloid with a metal stoichiometry of $Cu_{1.10}In_{0.68}Ga_{0.23}$ produced a Cu—In—Ga—Se precursor film with a metal stoichiometry of $Cu_{1.13}In_{0.64}Ga_{0.23}$; a difference that is approximately equal to the error associated with the ICPAES measurement itself. Thus, when a particular cation ratio is desired in the sprayed film (e.g., $Cu_xIn_yGa_z$), it is realized by dissolving the corresponding molar ratio of metal iodides (e.g., x CuI+y InI$_3$+z GaI$_3$) in pyridine, reacting this solution with a methanolic Na$_2$Se solution, and then spraying the purified Cu—In—Ga—Se colloid onto a heated substrate. The fact that no difference is observed between the metal iodide stoichiometry in the reaction flask and the metal selenide stoichiometry in the precursor film substantiates the viability of this approach. The utility of this nanoparticle precursor method lies in the ability to control subsequent film stoichiometries via initial solution synthesis.

EXAMPLE 2

CdS nanoparticle colloids were prepared by reacting CdI$_2$ in methanol with Na$_2$S in methanol at reduced temperature under inert atmosphere as follows:

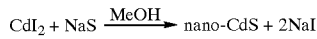

This reaction system is convenient in that the byproduct of the reaction (i.e., NaI) is soluble in the methanol solvent while the product nanoparticles are not. During the chemical workup. NaI salt is removed from the product mixture with the remaining CdS nanoparticles forming a stable. methanolic colloid. Yields for this reaction typically exceed 90% as determined in sacrificial samples via solvent evaporation.

The CdS nanoparticles were characterized by TEM and XRD. TEM of one sample collected using a Philips CM30 showed lots of assymetric particles with diameters around 16 nm along with some discrete particles and some nanosized amorphous fraction. XRD of the as-synthesized sample was performed on a Scintag X1 diffraction system and showed only broad peaks indicative of an amorphous phase. Next, the CdS sample was annealed under inert atmosphere (i.e., N$_2$(g)) at 660_C. for 1 minute. XRD characterization of the thermally-treated CdS sample showed CdS Greenockite phase formation. See Joint Committee, No.6-314 (CdS) supra.

EXAMPLE 3

A nonaqueous colloidal suspension was prepared by adding 0.516 g cadmium iodide (1.41 mmol) to a 500 ml side-arm round bottom flask fitted with a Teflon-coated stir bar. and adding 0.267 g sodium telluride (1.54 mmol) to a 250 ml side-arm round bottom flask fitted with a Teflon-coated stir bar in an inert atmosphere glove box. After attaching each of these flasks to a Schlenk vacuum line, 200 ml freshly distilled and deoxygenated acetonitrile was added to the cadmium iodide flask. Simultaneously, 15 ml freshly distilled and deoxygenated methanol was added to the sodium telluride flask in order to solubilize the sodium telluride. While the contents of each of the flasks were stirred, the flasks were cooled to 0° C. by employing ice baths over a period of 20 minutes. A small-gauge canula then was employed to transfer the sodium telluride/methanol solution to the cadmium iodide/acetonitrile mixture, at which time a dark red precipitate slurry formed. The precipitate was allowed to settle and the colorless supernatant was decanted and discarded. The remaining dark red precipitate slurry along with remaining liquid was divided into two equal portions and each protion was transferred to a respective 40 ml centrifuge tube and centrifuged for 15 minutes at 4,000 r.p.m. to thereby remove additional supernatant which was decanted and discarded. Thereafter, acetonitrile was added to fill each tube and the resulting mixture was subjected to sonication for 15 minutes (to disperse the nanoparticles) and subsequent centrifugation for 15 minutes at 4,000 r.p.m. At the completion of centrifugation, the resulting supernatant was dark red, indicative of the formation of a colloidal suspension. After dilution of this suspension with acetonitrile to thereby yield a transparent colloidal suspension with absorbance approximately equal to one, a clear orange colloidal suspension was formed. The colloidal suspension was subjected to UV-Vis spectroscopic characterization which showed almost zero absorbance at 850 nm, indicative of no agglomeration. Additionally, a zero-point of the second derivative of the absorbance curve was observed at 585 nm, corresponding to cadmium telluride nanoparticles on the order of 30 Å in diameter using tight binding calculations.

EXAMPLE 4

A nonaqueous colloidal suspension was prepared by adding 1.033 g cadmium iodide (2.82 mmol) to a 500 ml side-arm round bottom flask fitted with a Teflon-coated stir bar, and adding 0.502 g sodium telluride (2.89 mmol) to a 250 ml side-arm round bottom flask fitted with a Teflon-coated stir bar in an inert atmosphere glove box. After attaching each of these flasks to a Schlenk vacuum line, 250 ml freshly distilled and deoxygenated methanol was added to the cadmium iodide flask and 30 ml freshly distilled and deoxygenated methanol was added to the sodium telluride flask. While the contents of each of the flasks were stirred, the flasks were cooled to −78° C. by employing dry ice/isopropanol baths over a period of 25 minutes. A small-gauge canula then was employed to transfer the sodium telluride/methanol solution to the cadmium iodide/methanol mixture, at which time a dark red precipitate slurry formed. The precipitate was allowed to settle and the colorless supernatant was decanted and discarded. The remaining dark red precipitate slurry was divided into two equal portions and each portion was transferred to a respective 40 ml centrifuge tube. Each tube was filled with methanol and sonicated for 15 minutes to solubilize any remaining sodium iodide. Each of the tubes were centrifuged for 10 minutes at 4,000 r.p.m. and the resulting colorless methanol supernatant was decanted and discarded. Thereafter, acetonitrile was added to fill each tube and the resulting mixture was subjected to sonication for 15 minutes and subsequent centrifugation for 10 minutes at 4,000 r.p.m. At the completion of centrifugation, the resulting supernatant was dark red, indicative of the formation of a colloidal suspension. After dilution of this suspension with acetonitrile to thereby yield a transparent colloidal suspension with absorbance approximately equal to one, a clear orange colloidal suspension was formed. The colloidal suspension was subjected to UV-Vis spectroscopic characterization which showed almost zero absorbance at 850 nm, indicative of no agglomeration. Additionally, a zero-point of the second derivative of the absorbance curve was observed at 593 nm, corresponding to cadmium telluride nanoparticles on the order of 30 Å in diameter using tight binding calculations.

The foregoing description is considered as illustrative only of the principles of the invention. Further, since numerous modifications and changes will readily occur to those skilled in the art, it is not desired to limit the invention to the exact construction and process shown as described above. Accordingly, resort may be made to all suitable modifications and equivalents that fall within the scope of the invention as defined by the claims which follow.

The embodiments of the invention in which an exclusive property or privilege is claimed are defined as follows:

1. A nonaqueous colloidal suspension comprising metal chalcogenide nanoparticles and a volatile capping agent, wherein said metal chalcogenide nanoparticles are selected from the group consisting of $Cu(In_{1-x}Ga_x)Se_y$, where x is 0–1 and y is 1 or 2, CdS, ZnSe, ZnS, ZnTe, PbSe, PbS, and PbTe.

2. The nonaqueous colloidal suspension of claim 1, wherein said volatile capping agent is selected from the group consisting of ammonia, methyl amine, ethyl amine, acetonitrile, ethyl acetate, methanol, ethanol, propanol, butanol, pyridine, ethane thiol, tetrahydrofuran, and diethyl ether.

3. The nonaqueous colloidal suspension of claim 1, wherein said volatile capping agent is methanol, acetonitrile or pyridine.

4. The nonaqueous colloidal suspension of claim 1, wherein said metal chalcogenide nanoparticles have an average particle size of from about 1 to about 100 nm.

5. The nonaqueous colloidal suspension of claim 1, wherein said metal chalcogenide nanoparticles have an average particle size of from about 10 to about 30 nm.

6. A method for making a nonaqueous colloidal suspension of metal chalcogenide nanoparticles, the method comprising:

(a) reacting a metal salt with a chalcogenide salt to form the metal chalcogenide nanoparticles under conditions which exclude water, wherein said metal chalcogenide nanoparticles are selected from the group consisting of $Cu(In_{1-x}Ga_x)Se_y$, where x is 0–1 and y is 1 or 2, CdS, ZnSe, ZnS, ZnTe, PbSe, PbS, and PbTe; and (b) mixing said metal chalcogenide nanoparticles with a volatile capping agent under conditions which exclude water to form the nonaqueous colloidal suspension.

7. The method of claim 6, wherein the metal salt is selected from the group consisting of metal halogenides, metal sulfates, metal nitrates, metal phosphates, complex metal salts, metal alcoholates, metal phenolates, metal carbonates, metal carboxylates, and metallo-organic compounds.

8. The method of claim 6, wherein said metal salt is metal iodide.

9. The method of claim 6, wherein said chalcogenide salt contains an alkali metal or an alkaline-earth metal.

10. The method of claim 6, wherein said chalcogenide salt contains sodium.

11. The method of claim 6, wherein said volatile capping agent is selected from the group consisting of ammonia, methyl amine, ethyl amine, actonitrile, ethyl acetate, methanol, ethanol, propanol, butanol, pyridine, ethane thiol, tetrahydrofuran, and diethyl ether.

12. A method for making a nonaqueous colloidal suspension of metal chalcogenide nanoparticles, the method comprising:

(a) reacting a metal salt with a chalcogenide salt to form the metal chalcogenide nanoparticles under conditions which exclude water; and (b) mixing said metal chalcogenide nanoparticles with a volatile capping agent under conditions which exclude water to form the nonaqueous colloidal suspension, wherein said volatile capping agent is acetonitrile or pyridine.

13. The method of claim 6, including reacting a metal salt with a chalcogenide salt in an organic solvent to form the metal chalcogenide nanoparticles and a soluble byproduct.

14. The method of claim 13, wherein said organic solvent is selected from the group consisting of methanol, ethanol, propanol, butanol, diethyl ether, dibutyl ether, tetrahydrofuran, butoxyethanol, ethyl acetate, pentane, hexane, cyclohexane, and toluene.

15. The method of claim 13, wherein said organic solvent is methanol.

16. The method of claim 13, including separating the metal chalcogenide nanoparticles from a soluble byproduct prior to mixing said metal chalcogenide particles with a volatile capping agent.

17. The method of claim 16, wherein the step of separating the metal chalcogenide nanoparticles further includes of:

(a) sonicating a mixture of the metal chalcogenide nanoparticles and a soluble by product; and (b) centrifuging the mixture from step (a) to form a slurry of metal chalcogenide nanoparticles and a supernatant comprising the soluble byproduct.

18. The method of claim 17, including decanting the supernatant from the slurry of metal chalcogenide nanoparticles.

19. The method of claim 6, wherein said mixing the metal chalcogenide nanoparticles with a volatile capping agent includes the step of sonicating a mixture of the metal chalcogenide nanoparticles and the volatile capping agent.

20. The method of claim 6, wherein said metal chalcogenide nanoparticles are selected from the group consisting of $Cu(In_{1-x}Ga_x)Se_2$ and CdS.

21. A method for making a nonaqueous colloidal suspension of metal chalcogenide nanoparticles, the method comprising:

(a) reacting a metal salt with a chalcogenide salt in a nonaqueous medium comprising a volatile capping agent under conditions which exclude water to form the metal chalcogenide nanoparticles and a soluble byproduct;

(b) separating the metal chalcogenide nanoparticles from the soluble byproduct; and (c) mixing the metal chalcogenide nanoparticles with the volatile capping agent under conditions which exclude water to form the nonaqueous colloidal suspension.

22. The method of claim 21, wherein the step of separating the metal chalcogenide nanoparticles further includes:

(a) sonicating a mixture of the metal chalcogenide nanoparticles and a soluble byproduct; and (b) centrifuging the mixture from step (a) to form a slurry of metal chalcogenide nanoparticles and a supernatant comprising the soluble byproduct.

23. The method of claim 22, including decanting the supernatant from the slurry of metal chalcogenide nanoparticles.

24. The method of claim 21, wherein the metal salt is selected from the group consisting of metal halogenides, metal sulfates, metal nitrates, metal phosphates, complex metal salts, metal alcoholates, metal phenolates, metal carbonates, metal carboxylates, and metallo-organic compounds.

25. The method of claim 21, wherein said metal salt is metal iodide.

26. The method of claim 21, wherein said chalcogenide salt contains an alkali metal or an an alkaline-earth metal.

27. The method of claim 21, wherein said chalcogenide salt contains sodium.

28. The method of claim 21, wherein said volatile capping agent is selected from the group consisting of ammonia, methyl amine, ethyl amine, actonitrile, ethyl acetate, methanol, ethanol, propanol, butanol, pyridine, ethane thiol, tetrahydrofuran, and diethyl ether.

29. The method of claim 21, wherein said volatile capping agent is selected from the group consisting of methanol, acetonitrile and pyridine.

30. The method of claim 21, wherein said nonaqueous medium further comprises an organic solvent.

31. The method of claim 30, wherein said organic solvent is selected from the group consisting of methanol, ethanol, propanol, butanol, diethyl ether, dibutyl ether, tetrahydrofuran, butoxyethanol, ethyl acetate, pentane, hexane, cyclohexane, and toluene.

32. The method of claim 30, wherein said organic solvent is methanol.

33. The method of claim 21, wherein mixing the metal chalcogenide nanoparticles with the volatile capping agent includes the step of sonicating a mixture of the metal chalcogenide nanoparticles and the volatile capping agent.

34. The method of claim 21, wherein said metal chalcogenide nanoparticles are selected from the group consisting of $Cu(In_{1-x}Ga_x)Se_2$, CdS, and CdTe.

35. A method of forming a film of metal chalcogenide semiconductor material on a surface of a substrate, comprising:

(a) preparing a nonaqueous colloidal suspension comprising metal chalcogenide nanoparticles and a volatile capping agent under conditions which exclude water, wherein said metal chalcogenide nanoparticles are selected from the group consisting of $Cu(In_{1-x}Ga_x)Se_y$, where x is 0–1 and y is 1 or 2, CdS, ZnSe, ZnS, ZnTe, PbSe, PbS, and PbTe; and (b) depositing the colloidal suspension from step (a) onto the surface of the substrate.

36. The method of claim 35, wherein said step of depositing the nonaqueous colloidal suspension further comprises the step of heating the substrate to a temperature sufficient to cause fusion of the metal chalcogenide nanoparticles to produce a continuous metal chalcogenide film.

37. The method of claim 35, wherein said nonaqueous colloidal suspension is spray deposited onto said surface of said substrate.

38. The method of claim 36, wherein said temperature is less than about 300° C.

39. The method of claim 36, wherein said temperature is less than about 270° C.

40. The method of claim 36, wherein said temperature is less than about 240° C.

41. The method of claim 35, wherein said substrate is soda-lime glass.

42. The method of claim 35, wherein said surface comprises a smooth metallic layer or a layer of a transparent conductive oxide.

43. A film of metal chalcogenide material produced by the method of claim 35.

* * * * *